United States Patent [19]
Cai

[11] Patent Number: 5,793,643
[45] Date of Patent: Aug. 11, 1998

[54] METHOD FOR HANDLING VARIABLE WIDTH WIRES IN A GRID-BASED CHANNEL ROUTER

[75] Inventor: Yang Cai, San Jose, Calif.

[73] Assignee: Avant! Corporation, Fremont, Calif.

[21] Appl. No.: 643,061

[22] Filed: Apr. 30, 1996

[51] Int. Cl.[6] .................................................. G06F 17/50
[52] U.S. Cl. ........................... 364/491; 364/488; 364/489; 364/490
[58] Field of Search ................................. 364/488–491

[56] References Cited

U.S. PATENT DOCUMENTS

| | | | |
|---|---|---|---|
| 4,811,237 | 3/1989 | Putatunda et al. | 364/491 |
| 5,272,645 | 12/1993 | Kawakawi et al. | 364/491 |
| 5,636,129 | 6/1997 | Her | 364/488 |

OTHER PUBLICATIONS

Dubois et al. "New Advances in the Routing of Mixed Analog and Digital Channels," IEEE, 1991, pp. 1956–1959.
Fang et al. "A New Efficient Approach to Multilayer Channel Routing Problem," ACM/IEEE, 1992, pp. 579–584.
Patrick Groeneveld, "A Multiple Layer Contour Based Gridless Channel Router," IEEE, 1990, pp. 1278–1288.
Bryan Preas, "Channel Routing with Non–Terminal Doglegs," IEEE, 1990, pp. 451–458.

*Primary Examiner*—Emanuel Todd Voeltz
*Assistant Examiner*—Vuthe Siek
*Attorney, Agent, or Firm*—Thomas E. Schatzel; Law Offices of Thomas E. Schatzel A Prof. Corporation

[57] ABSTRACT

In a grid-based channel router, a method for handling variable width wires. The user initially specifies the widths of the wires. In this manner, wider wires may be selected for special nets, such as those used for routing clock signals, whereas narrower wires are used for normal nets in order to minimize the die size. A refined grid map is generated. This refined grid map consists of extra rows and columns for marking the variable width wires. These extra rows and columns are spaced as a function of the wire width and are marked the same as with normal rows and columns. Before a wire is placed, the affected rows or columns are checked for any violations. If there are no violations, the wire is placed and the appropriate rows or columns are marked. Due to the extra rows and columns, the problems associated with overmarking and undermarking variable width wires are avoided.

9 Claims, 6 Drawing Sheets

Fig. 5
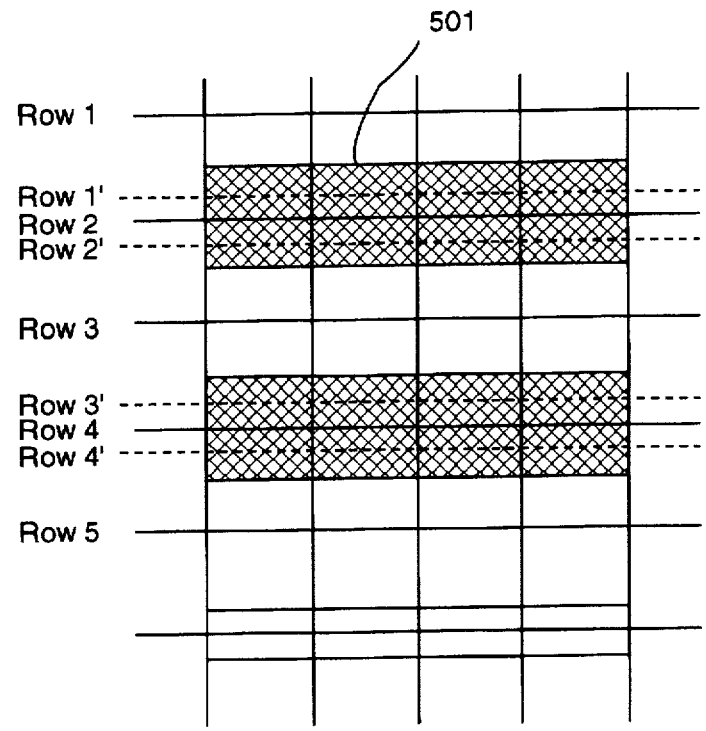
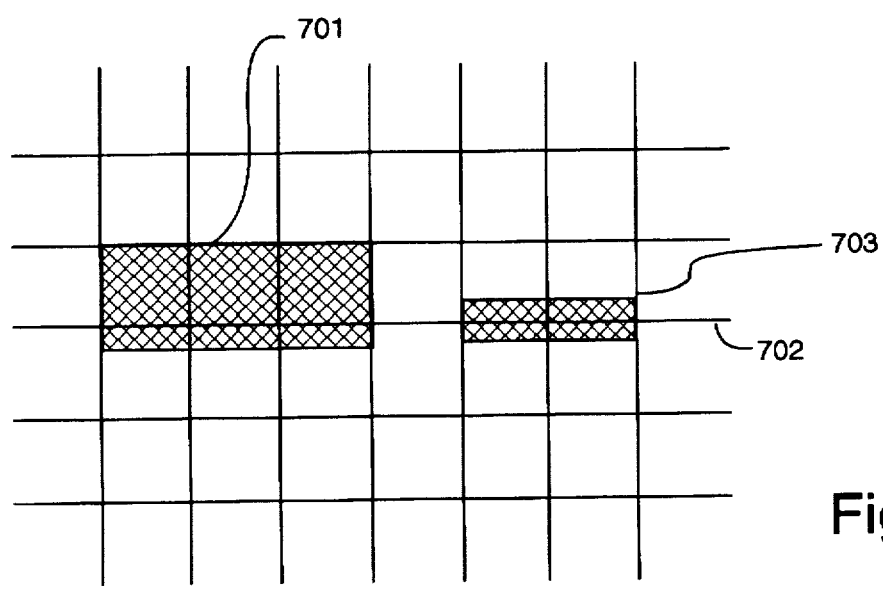
Fig. 7

METHOD FOR HANDLING VARIABLE WIDTH WIRES IN A GRID-BASED CHANNEL ROUTER

FIELD OF THE INVENTION

The present invention pertains to a method for handling variable width wires in a grid-based channel router.

BACKGROUND OF THE INVENTION

Advances in semiconductor technology have led the way towards more versatile, powerful, and faster integrated circuit (IC) chips in the fields of computer systems, telecommunications, instrumentation, etc. The trend is towards even larger, more complex and sophisticated IC chips in an effort to meet and improve upon the demands imposed by state-of-the-art performance. Today, a single IC chip can contain upwards of millions of transistors. As the complexity, functionalities, speed, and size of these chips increase, it is becoming a much more critical and difficult task to properly design, layout, and test the next generation of chips.

In order to meet these demands, a highly specialized field, commonly referred to as "electronic design automation" (EDA), has evolved, whereby computers are extensively used to automate the design, layout, and testing process. Indeed, it has now come to the point where the process has become so overwhelming that integrated circuits cannot be designed without the help of computer-aided design (CAD) systems. Computers are ideally suited to these tasks because they can be programmed to reduce or decompose large, complicated circuit designs into a multitude of much simpler functions. Whereupon, the computers can be programmed to iteratively solve these much simpler functions. In addition, CAD tools may then be employed to compact or otherwise minimize the die size required for a particular circuit. Minimizing the die size is important because as the die size shrinks, more dies (i.e., chips) can be fabricated from a given wafer. This directly translates into lower production costs.

Typically, the process begins with an engineer defining the input/output signals, desired functionalities, and performance characteristics of the new IC chip. This information is fed into a logic synthesis program which generates a specification defining the integrated circuit in terms of a particular semiconductor technology (e.g., very large scale integration—VLSI). This specification can be regarded as a template for the realization of the physical embodiment of the integrated circuit in terms of transistors, routing resources, etc. Next, a place and route CAD tool is used to determine the routing, pinouts, wiring, interconnections and general physical layout of the chip.

One common method used in the layout of a chip involves a grid-based channel approach. In this approach, the routing area (i.e., the channel) of the chip is divided into a number of different metal layers. Each of the metal layers is comprised of straight lines or tracks that run in one axis. For example, the metal1 and metal3 layers might have rows of tracks running horizontally, whereas the metal2 layer is comprised wholly of columns of tracks running vertically. Vias are used to connect the tracks of one metal layer to the tracks of another metal layer. Hence, these overlapping layers define a "grid map." Whenever a new routing object is implemented, its existence is "marked" on the grid map. The purpose of marking objects is to check for violations whenever a new object is desired to be inserted. In other words, before the new routing object is allowed to be inserted, it must first be checked against pre-existing marked objects and blockages to determine whether adding that new object would result in any violations (e.g., short circuits).

In the past, it was relatively easy to mark wires because the wires had a fixed, pre-determined width. All of the wires in a metal layer had the same, known width. Consequently, when a column or row was marked, the edges to which the wire extended was known. However, in many designs, it is advantageous to use wider or narrower width wires, depending upon the signal characteristics being conveyed by those wires. As a general rule, a wider wire intrinsically exhibits less delay and is better at preserving signal integrity. Hence, it is desirable to implement time sensitive paths and critical nets, such as those used to route CLOCK and RESET signals, with wider wires. This helps minimize skew, crosstalk, power, and timing problems. Of course, it would be uneconomical to use the wider wires for all connections, since this would substantially increase the overall die size. A larger die size directly translates into higher production costs because less dies (i.e., chips) can be fabricated from a given wafer.

Due to the extremely high complexity of projecting variable width objects, prior art systems have typically not been able to handle all kinds of variable width routing requirements. Furthermore, prior art systems have placed limitations on the number of variable width nets, the choices of variable widths, and the wiring patterns of variable width nets. Thus, there is a need for a grid-based channel router that can handle variable width wires, especially when it is becoming increasingly important to be able to route signal nets with variable widths in order to meet the stringent performance constraints in the deep sub micron domain. The present invention offers such a grid-based channel router solution.

SUMMARY OF THE INVENTION

The present invention pertains to a grid-based channel router that can handle variable width wires. Initially, a user specifies the widths of the wires. In this manner, wider wires may be selected for special nets, such as those used for routing clock signals, whereas narrower wires are used for normal nets in order to minimize the die size. A grid map is generated. The grid map consists of rows and columns corresponding to the metal layers of an integrated circuit layout. The metal layers are used to route horizontal and vertical wires. In the present invention, the grid map is refined by adding extra rows and columns. These extra rows and columns are used for marking wires that can have variable widths. These extra rows and columns are spaced as a function of the wire width and are marked the same as with normal rows and columns. Before a wire is placed, the affected rows or columns are checked for any violations. If there are no violations, the wire is placed, and the appropriate rows or columns are marked. Due to the extra rows and columns, the problems associated with overmarking and undermarking variable width wires are avoided.

BRIEF DESCRIPTION OF THE DRAWINGS

The present invention is illustrated by way of example, and not by way of limitation, in the figures of the accompanying drawings and in which like reference numerals refer to similar elements and in which:

FIG. 5 shows a grid map having extra rows for handling variable width wires in the horizontal direction.

FIG. 7 shows a grid map having a variable width wire associated with a non-pin connection.

DETAILED DESCRIPTION

A grid-based channel router capable of handling variable width wires is described. In the following description, for purposes of explanation, numerous 5 specific details are set forth in order to provide a thorough understanding of the present invention. It will be obvious, however, to one skilled in the art that the present invention may be practiced without these specific details. In other instances, well-known structures and devices are shown in block diagram form in order to avoid obscuring the present invention.

Figure 1:
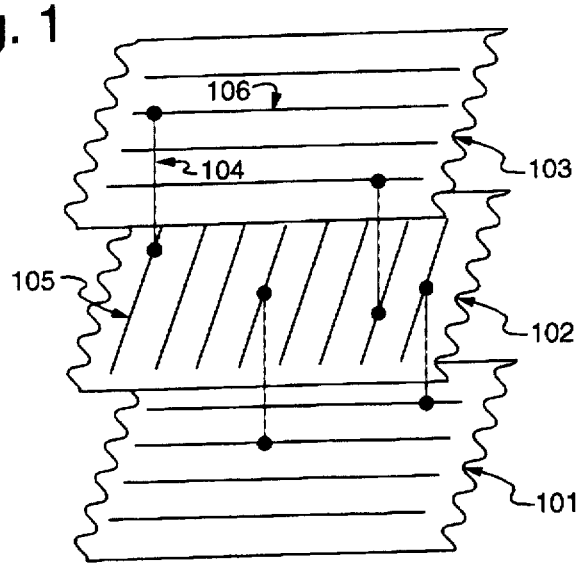
FIG. 1 shows a channel grid map which is comprised of three metal layers.

FIG. 1 shows a channel grid map which is comprised of three metal layers 101-103. Metal1 layer 101 and metal3 layer 103 are comprised of horizontal tracks, whereas the metal2 layer 102 is comprised of vertical tracks. These horizontal and vertical tracks define an overlapping grid upon the routing or channel area. Vias are used to connect the track of one metal layer to the track of another metal layer. For example, via 104 connects vertical track 105 of metal2 layer 102 to a horizontal track 106 of the metal3 layer 103. The pins are connected to the metal2 layer 102 and routed through the metal1 and metal2 layers to other points by means of the vias. It should be noted that the present invention may be applied to any number of metal layers as well as to different grid configurations.

Figure 2:
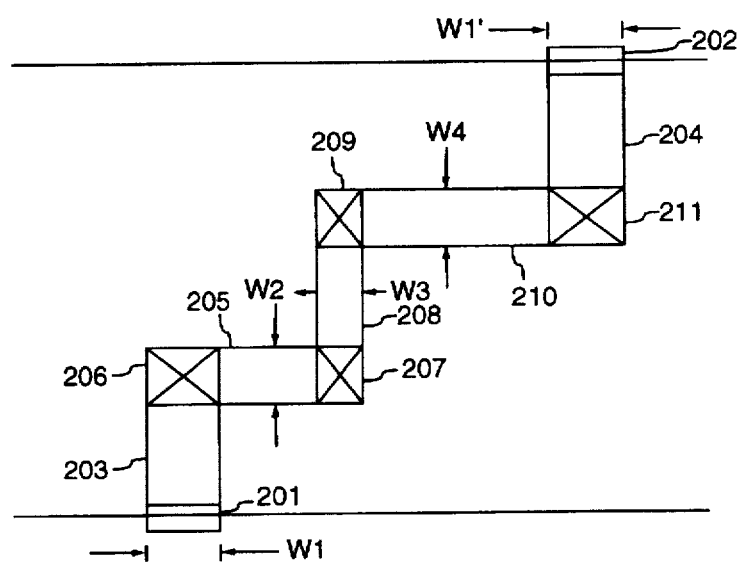
FIG. 2 shows a sample connection of two pins on a grid map.

FIG. 2 shows a sample connection of two pins 201 and 202 on a grid map. Wire 203 is connected to pin 201 and resides on the metal2 layer. It is connected to wire 205 through means of via 206. Horizontal wire 205 can exist either on the metal1 layer or the metal3 layer. Via 207 is used to connect wire 205 to wire 208. Wire 208 resides on the metal2 layer. Similarly, via 209 connects wire 208 to wire 210. Wire 210 may exist either on the metal1 layer or the metal3 layer. Finally, via 211 connects wire 210 to wire 204 and, hence, pin 202. Wires 203 and 204 share the same width, WI, as their respective pins 201 and 202. It should be noted that the pins could have different widths as well. However, in the present invention, wires 205, 208, and 210 can have variable widths W2, W3, and W4. Width W2 may be different from width W4, even though the wires are on the same layer. In other words, wires residing on the same layer (or different layers), may have different widths. The widths may be specified by the user or assigned according to programmed directives.

Before a wire is placed, a determination is made as to whether the wire would result in any violations with pre-existing objects. This is accomplished by checking the grid map. The grid map contains information regarding preexisting objects. Each time an object is placed, it is "marked" to indicate its existence. The marking is performed on a point basis on the grid map. Each point connects a vertical column to a horizontal row. Hence, two numbers are assigned to each point. These two numbers indicate the status for that particular point. One of the numbers is used to mark the column, while the other number is used to mark the row. If there are no violations, the wire is placed and accordingly marked.

Figure 3:
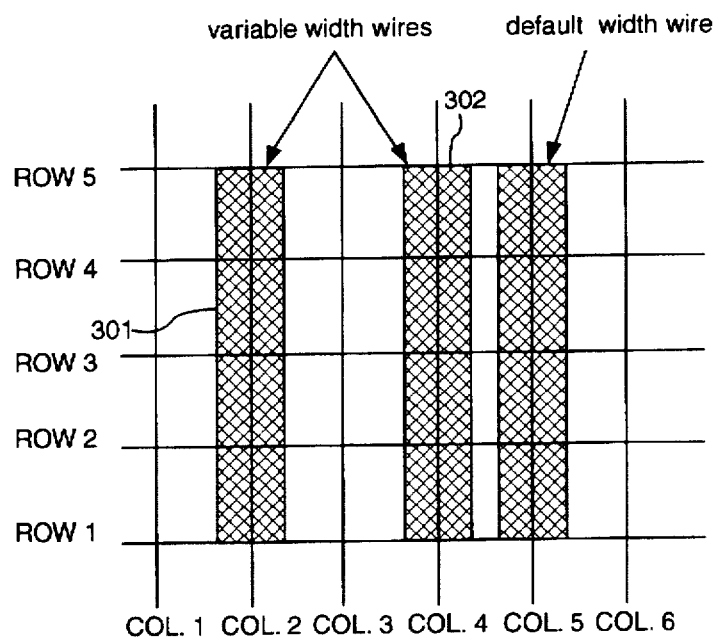
FIG. 3 shows a grid map having two wires.

FIG. 3 shows a grid map having two wires 301 and 302. Wire 301 is vertical and extends through column 2, and wire 302 extends through column 4. If these two wires were to have variable widths, there is a dilemma in determining how they are to be marked. One might be cautious and mark all adjacent columns in order to ensure that no violations can occur. For example, mark column 1 and column 3 when wire 301 is placed. This ensures that no wires can then be placed in those two columns. However, this overmarking strategy is flawed because it might block otherwise legal adjacent pins. For example, overmarking the variable width wire 302 at column 4 would result in column 3 being blocked. In turn, this causes the pin at column 2 to be blocked and creates an open circuit because any connection to it is no longer legal due to the marked status of column 3. In other words, a check of the marked status of column 3 would indicate that a wire cannot be placed in column 2 because this would purportedly result in a short circuit violation; the right edge of column 2 would touch the left edge of marked column 3. In reality, however, it is perfectly fine to make the connection to column 2. Thus, overmarking is disadvantageous because it leads to under utilization of resources which are otherwise available to the user as well as potential open circuits.

On the other hand, undermarking is also disadvantageous. Undermarking variable width wires on the columns is dangerous because it might result in an undetected violation. In other words, a wire might be placed in a column under the mistaken belief that it was safe to do so, when in reality, it should have been restricted from being placed in that particular column. For example, undermarking occurs if column 5 were not to be marked when the wire at column 4 is placed. Subsequently, the channel router might mistakenly believe that it is legal to place a wire along column 5 since it is not marked. This would result in a design rule violation because there is not enough space between the edge of the wire in column 5 and the edge of the wire 302 of column 4. Thus, there are problems associated with overmarking and undermarking the rows and columns of a grid map when variable width wires are concerned.

Figure 4:
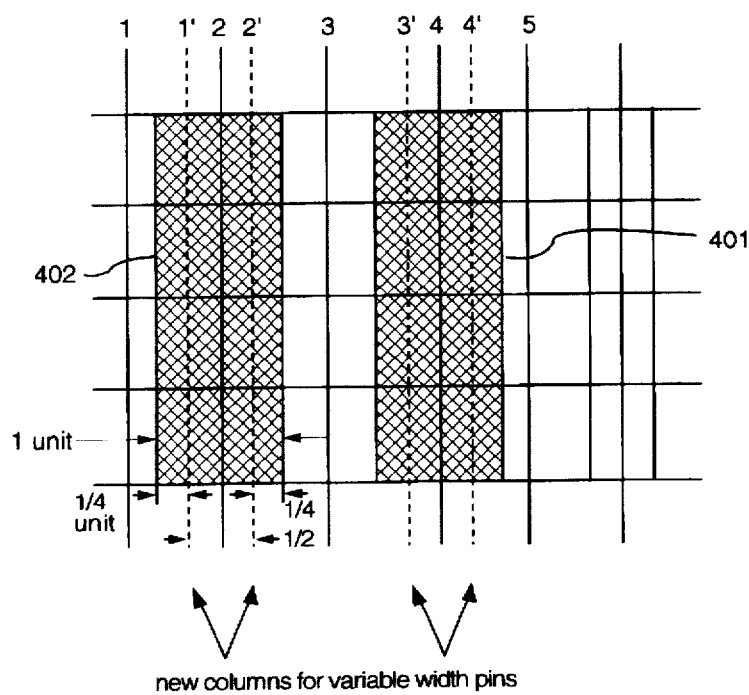
FIG. 4 shows an example of an improved grid map having additional columns for handling variable width wires.

The present invention solves the problems inherent with overmarking and undermarking by refining the grid map. In the present invention, additional columns and rows are introduced for variable width pins and/or wires. FIG. 4 shows an example of an improved grid map having additional columns for handling variable width wires. As with original grid maps, a number of initial columns, such as columns 1–4, are defined. In addition to these original columns, new columns 1', 2', 3', and 4' are added. Column 1' is inserted between columns 1 and 2; column 2' is inserted between columns 2 and 3; column 3' is inserted between columns 3 and 4; etc. In the currently preferred embodiment, given that the width of a wire is one unit wide, three columns are defined such that one column runs through the middle of the wire and the other two refined columns are one-quarter unit width from the edges. Hence, the extra columns are added in locations as a function of the width of the wire. In alternative embodiments, the refined columns may be placed in locations which are not equidistant. Now, when a variable width wire is placed, the new columns through which that wire is placed, are marked as well. The effects of a variable width wire on these inserted columns are the same as that of a default width wire having a standard, constant width. The existence of a variable width wire is marked on the corresponding column(s) containing that wire.

For example, the variable width wire 401 straddles columns 3', 4, and 4'. Hence, these three columns are marked. Note that connections to the pin at column 2 can now be made. Prior to the connection to the pin at column 2, a check of its corresponding columns 1', 2,2', and 3 must be made. This check reveals that none of the columns have been marked yet. Consequently, the channel router knows that it is legal to establish the variable wire connection 402 to the pin at column 2. Hence, the present invention overcomes the under utilization problem associated with undermarking. Once the variable wire 402 is established, columns 1', 2, and 2' are marked. Moreover, the channel router knows that it would be illegal to establish any connections to column 3 because columns 2' and 3' are now marked. Likewise, the channel router knows that a default width wire cannot be placed at column 5 because, in trying to do so, it has to check the status of column 4'. In checking column 4', it is determined that column has been marked. Connections to variable width pins are guaranteed without producing violations. Thus, the present invention overcomes the missed violations problem associated with overmarking.

FIG. 5 shows a grid map having extra rows for handling variable width wires in the horizontal direction. In addition to the traditional rows 1–5, additional rows 1', 2', 3', and 4' are added. Row 1' is inserted between rows 1 and 2; row 2' is inserted between rows 2 and 3; row 3' is inserted between rows 3 and 4; etc. Now, when a variable width wire is placed, the new rows through which that particular wire is placed, are marked as well. In other words, the existence of a variable width wire is marked on the corresponding row(s) containing that wire. For example, wire 501 existing on either the metal1 or metal3 layers, is placed through rows 1', 2, and 2'. Hence, those rows are marked. It should be noted that additional rows and columns may be added beyond those shown in FIGS. 4 and 5 (e.g., columns 1, 1', 1"; 2; 2', 2"; etc.).

Figure 6:
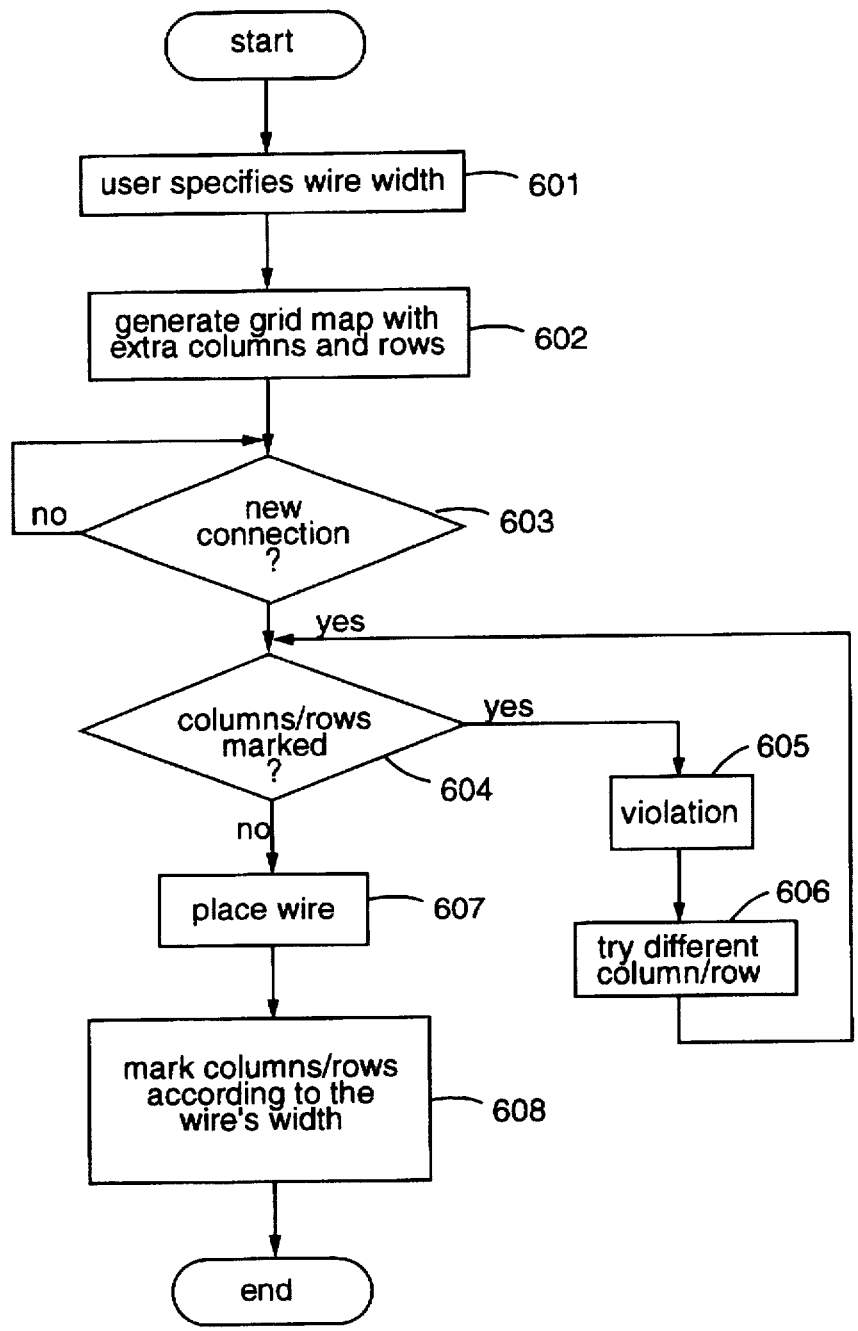
FIG. 6 is a flowchart describing the steps of how a channel router handles variable width wires.

FIG. 6 is a flowchart describing the steps of how a channel router handles variable width wires. Initially, in step 601, the user specifies the wire width. In an alternative embodiment, the channel router may automatically select the width of the wire according to pre-programmed guidelines. It should be noted that the present invention allows any width wire to be selected. Next, an enhanced grid map is generated, step 602. The enhanced grid map includes extra rows and columns. When a new connection is requested in step 603, a check is performed. The channel router checks the column(s) or row(s) that would be impacted by the new connection to determine whether they are marked, step 604. If any of those column(s) or row(s) happen to be already marked, then this indicates that placement of the wire in that location would result in a violation, step 605. In order to avoid violations, the channel router selects a different column or row, step 606. Step 604 is repeated for the alternative selection to check for any violations. If there are no violations, this indicates that the wire may legally be placed in the proposed location, step 607. Thereupon, the corresponding column(s) or row(s) through which the wire runs, are marked, step 608. The column(s) or row(s) are marked according to the width of that particular wire.

By utilizing the present invention, a user has the capability of specifying any number of variable width nets and their associated wiring patterns. The present invention also supports multiple wire widths for the same net in a single channel as well as width dependent spacing requirements. Consequently, a smaller die size can be achieved because one can use the smallest feasible wire width and select the best routing pattern available to optimize the utilization of routing resources. Furthermore, special nets can be treated as variable width nets and processed in the same manner. This provides a greater flexibility in handling special net routing on the one hand and reduces the complexity of channel routing on the other hand. Otherwise, two different types of routing objects would have to be accommodated. Moreover, with the present invention, better control over wiring patterns can be provided because variable width nets are treated the same as ordinary signal nets. Consequently, the existing control mechanism for signal nets can be fully utilized to control the wiring patterns of variable width nets to achieve optimal results.

Optional features and enhancements to the present invention are now discussed. In the currently preferred embodiment, jogs at a non-pin column for a variable width net are made by finding a wide open area that is available on the channel, such that overmarking does not pose any problems. One example of where this might occur relates to breaking vertical constraints. For connections along the channel direction, instead of placing the center of a wire on the current track (as for default width wires when a corresponding feasible link is chosen), the present invention places a variable width wire such that its effect on the current track is identical to that of a default width wire. FIG. 7 shows a grid map having a variable width wire associated with a non-pin connection. Due to its variable width, wire 701 ends up being off-center to the current track 702. In comparison, a standard default wire 703 would have been placed in the center of the track 702. By placing variable width wire 701 off-center in an open area and appropriately marking it as described above, this guarantees that no violations will be introduced with the objects routed in earlier tracks (e.g., feasible links). The variable width wire 701 is overmarked in order to ensure that no violations will be introduced in routing subsequent tracks because its presence is made known by marking on the grid map. Afterwards, a compaction routine is performed following the detailed routing phase to remove all unnecessary gaps from the channel in order to minimize its width. Hence, this overmarking does not result in extra silicon area being wasted because the compensation offered by the compaction routine.

Figure 8A:
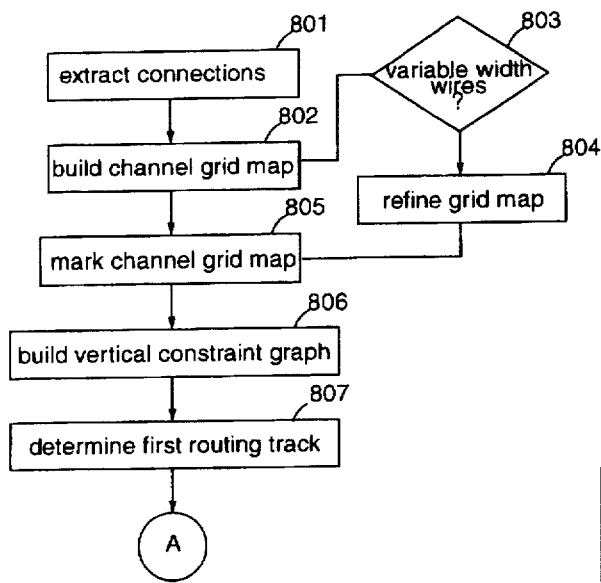
FIG. 8A is part of a flowchart describing the overall steps of the track assignment process according to the present invention.
Figure 8B:
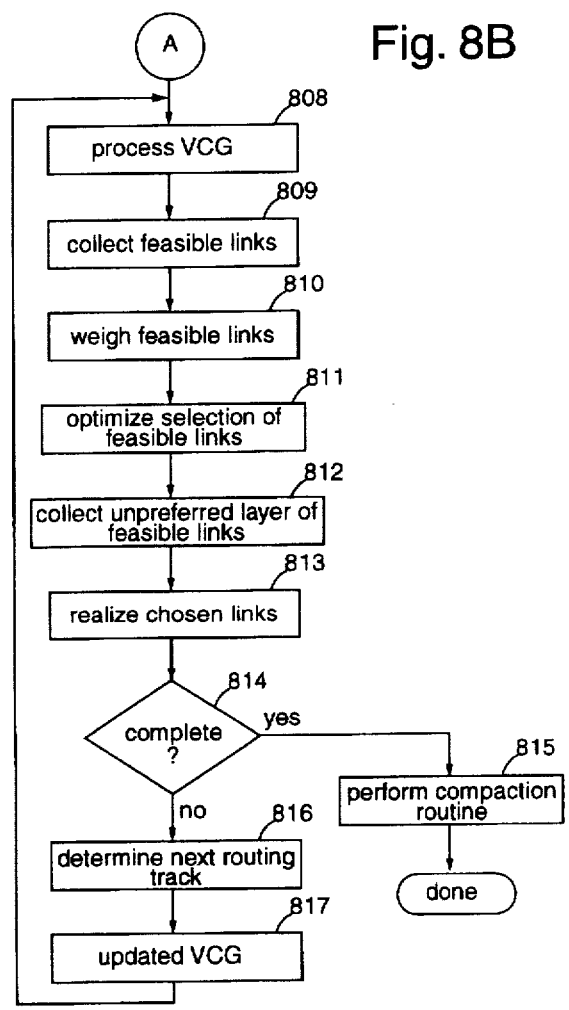
FIG. 8B is the remaining part of the flowchart describing the overall steps of the track assignment process according to the present invention.

FIGS. 8A and 8B are flowcharts describing the overall steps of the track assignment process according to the present invention. Initially in step 801, the connections information is extracted from a netlist specification that was generated according to the integrated circuit design. A global routing result specifies pin locations and which of the pins are to be connected. Next, the channel grid map is built in step 802. A determination is made in step 803 as to whether variable width wires are to be implemented. If so, the grid map is then refined by adding extra rows and columns in order to handle variable width wires, step 804. Otherwise, step 804 is skipped. For purposes of track assignment, the pins are represented as points which are to be connected. Pin "nets" comprised of three or more interconnected pins, are decomposed into simpler combinations of two-pin subnets. These two-pin subnets are referred to as "mapped segments." Processing is then performed on a mapped segment basis. Once the channel grid map has been built, existing objects (e.g., variable width wires, vias, etc.) are marked on the channel grid map, step 805. Next, a vertical constraint graph (VCG) is built according to the mapped segments, step 806. The VCG is used to maintain the relative positions of these segments inside the channel. A VCG is developed to contain the vertical dimensions of the lines for each mapped segment in order to prevent short circuits from occurring. After the VCG has been generated, the first track (i.e., a straight line of the grid along the channel direction) is computed, as shown in step 807.

In the currently preferred embodiment, tracks are assigned on an outside-in approach, whereby the first track is the best track that is selected from either the top-most or bottom-most position. Next, a track assignment cycle is repeated until all the requisite track assignments are made. The steps of this track assignment loop are shown in FIG. 8B as steps 808–817. Basically, the VCG is processed, step 808. All feasible links are then collected, step 809. The feasible links are weighted according to one or more weighting functions, step 810. Next, an optimal set of feasible links is selected according to the results of the weighting functions, step 811. The feasible links corresponding to the unpreferred layers are collected, and the chosen links are finally realized, steps 812–813. Step 814 determines whether all connections have been completed. If so, the compaction routine is performed in step 815 and the loop is done. Otherwise, the VCG is updated, and the loop is repeated for the next routing track, steps 816 and 817.

Figure 9:
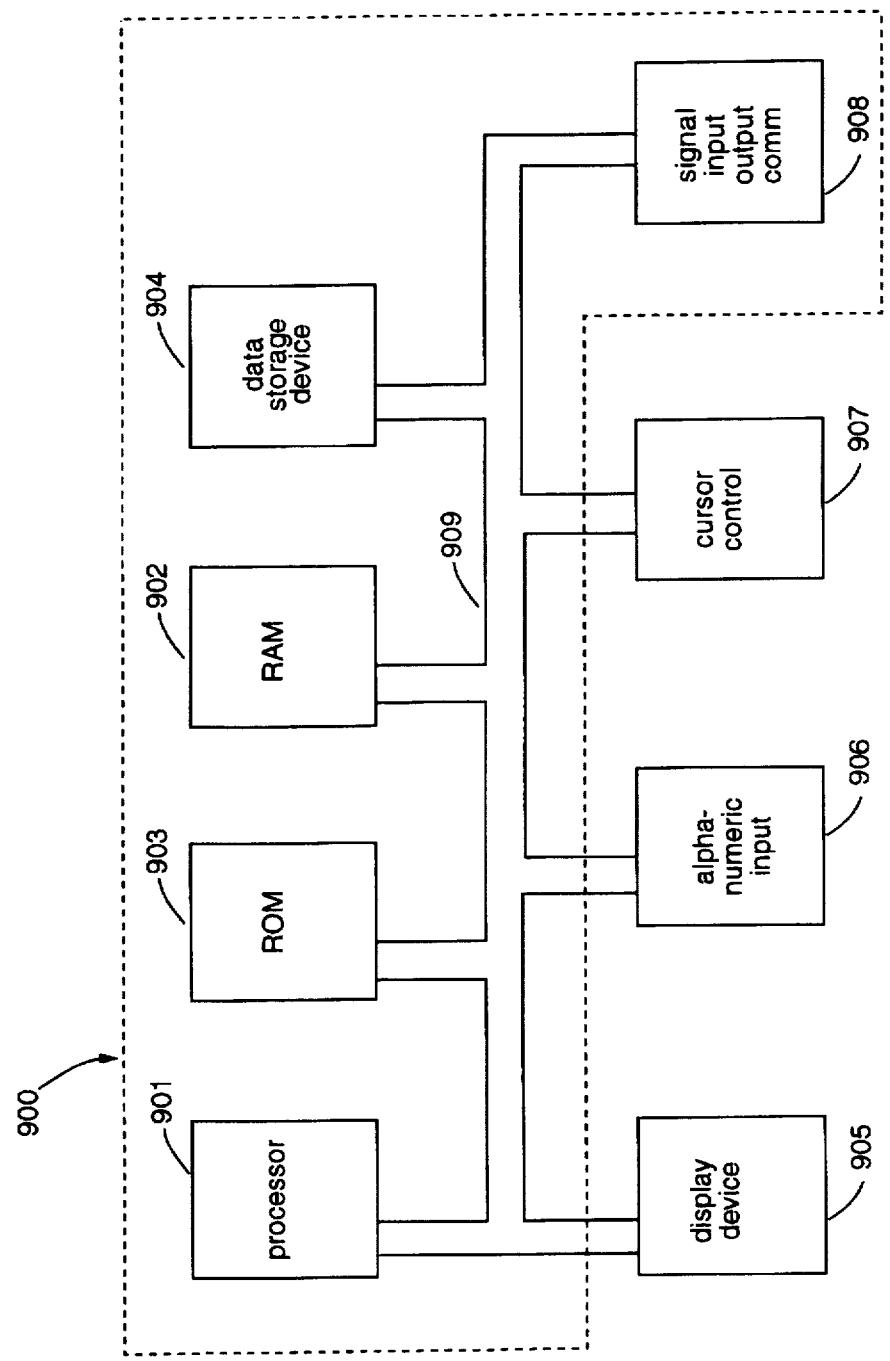
FIG. 9 illustrates an exemplary computer system upon which the present invention may be implemented or practiced.

FIG. 9 illustrates an exemplary computer system 900 upon which the present invention may be implemented or practiced. It is appreciated that the computer system 900 of FIG. 9 is exemplary only and that the present invention can operate within a number of different computer systems including general purpose computers systems, embedded computer systems, and computer systems specially adapted for electronic design automation. Computer system 900 of FIG. 9 includes an address/data bus 909 for conveying digital information between the various components, a central processor unit (CPU) 901 for processing the digital information and instructions, a random access memory (RAM) 902 for storing the digital information and instructions, a read only memory (ROM) 903 for storing information and instructions of a more permanent nature. In addition, computer system 900 may also include a data storage device 804 (e.g., a magnetic, optical, floppy, or tape drive) for storing vast amounts of data, and an I/O interface 908 for interfacing with peripheral devices (e.g., computer network, modem, etc.). It should be noted that the present invention may be embodied Devices which may be coupled to computer system 900 include a display device 905 for displaying information (e.g., channel grid map, vertical constraint graphs, weighting functions, feasible links, etc.) to a computer user, an alphanumeric input device 906 (e.g., a keyboard), and a cursor control device 907 (e.g., mouse, trackball, light pen, etc.) for inputting data and selections.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A computer-implemented method for preventing variable-width wire and pin placement violations caused by overmarking in a channel router, the method comprising the steps of:

specifying the width of at least one of a wire and a pin to have a particular width relative to a default width;

generating a channel grid map that includes a plurality of columns ($C_i$), wherein each column has at least one sub-column adjacent a first fraction of a default-wire width on the left ($C_i^-$) and at least one sub-column adjacent a second fraction of said default-wire width on the right ($C_i^+$); and placing said at least one of a wire and a pin in a particular column ($C_n$) that exists in said plurality of columns ($C_i$) by:

checking if a first mark indicates said particular column ($C_n$) is already used, checking if a second mark indicates a left sub-column ($C_i^-$) adjacent to said particular column ($C_n$) is already used, and checking if a third mark indicates a right sub-column ($C_i^-$) adjacent to said particular column ($C_n$) is already used;

placing said at least one of a wire and a pin in a particular column ($C_n$) if said first marking indicates said particular column ($C_n$) is not already used, and then marking said particular column ($C_n$) as being used, otherwise exiting the step of placing to avoid a violation;

if said at least one of a wire and a pin is placed in said particular column ($C_n$) and has a wide width, checking if said second marking indicates said left sub-column ($C_n^-$) is not already used, and then marking said left sub-column ($C_n^-$) as being used, otherwise exiting the step of placing to avoid a violation; and if said at least one of a wire and a pin is placed in said particular column ($C_n$) and has a wide width, checking if said third marking indicates said right sub-column ($C_n^+$) is not already used, and then marking said right sub-column ($C_n^+$) as being used, otherwise exiting the step of placing to avoid a violation.

2. The method of claim 1, if the step of placing was exited to avoid a violation, then further comprising the subsequent step of:

selecting a different column and then repeating the step of placing.

3. The method of claim 1, further comprising the subsequent step of:

compacting after completing a detailed routing phase to remove all unnecessary gaps from a channel in order to minimize a silicon area needed.

4. The method of claim 1, further comprising the preceding step of:

extracting a connections information from a netlist specification generated according to an integrated circuit design, wherein a global routing result specifies pin locations and their connections; and building said channel grid map and determining whether variable width wires are needed, if so, refining said channel grid map by adding extra columns in order to accommodate variable width wires.

5. A computer-implemented method for preventing variable-width wire and pin placement violations caused by overmarking in a channel router, the method comprising the steps of:

specifying the width of at least one of a wire and a pin to have a particular width relative to a default width;

generating a channel grid map that includes a plurality of rows ($R_i$), wherein each row has at least one sub-row adjacent a first fraction of a default-wire width on the lower ($R_i^-$) and at least one sub-row adjacent a second fraction of said default-wire width on the upper ($R_i^+$); and placing said at least one of a wire and a pin in a particular row ($R_n$) that exists in said plurality of rows ($R_i$) by:

checking if a first mark indicates said particular row ($R_n$) is already used, checking if a second mark indicates a lower sub-row ($R_i^-$) adjacent to said particular row ($R_n$) is already used, and checking if a third mark indicates a upper sub-row ($R_i^-$) adjacent to said particular row ($R_n$) is already used;

placing said at least one of a wire and a pin in a particular row ($R_n$) if said first marking indicates said particular row ($R_n$) is not already used, and then marking said particular row ($R_n$) as being used, otherwise exiting the step of placing to avoid a violation;

if said at least one of a wire and a pin is placed in said particular row ($R_n$) and has a wide width, checking if said second marking indicates said lower sub-row ($R_n^-$) is not already used, and then marking said lower sub-row ($R_n^-$) as being used, otherwise exiting the step of placing to avoid a violation; and if said at least one of a wire and a pin is placed in said particular row ($R_n$) and has a wide width, checking if said third marking indicates said upper sub-row ($R_n^+$) is not already used, and then marking said upper sub-row ($R_n^+$) as being used, otherwise exiting the step of placing to avoid a violation.

6. The method of claim 5, if the step of placing was exited to avoid a violation, then further comprising the subsequent step of:

selecting a different row and then repeating the step of placing.

7. The method of claim 5, further comprising the subsequent step of:

compacting after completing a detailed routing phase to remove all unnecessary gaps from a channel in order to minimize a silicon area needed.

8. The method of claim 5, further comprising the preceding steps of:

extracting a connections information from a netlist specification generated according to an integrated circuit design, wherein a global routing result specifies pin locations and their connections; and building said channel grid map and determining whether variable width wires are needed, if so, refining said channel grid map by adding extra rows in order to accommodate variable width wires.

9. A track assignment process, comprising the steps of:

extracting connections information from a netlist specification generated according to an integrated circuit design in which a global routing result specifies pin locations and the pins to be connected;

building a channel grid map;

determining whether variable width wires are to be implemented, and if so, refining said grid map by additional rows and columns in order to accommodate variable width wires;

representing pins as points to be connected, wherein a pin net is comprised of more than two interconnected pins and are decomposed into a set of mapped segments comprising simpler combinations of said two-pin subnets;

marking existing objects on said channel grid map;

building a vertical constraint graph (VCG) according to said set of mapped segments and to maintain the relative positions of said mapped segments inside a channel, wherein the vertical dimensions of any lines for each mapped segment are included to help prevent short circuits from occurring;

computing a first track comprising a straight line of said channel grid map along a channel direction; and repeating a track assignment cycle until all requisite track assignments are made, wherein said VCG is processed, all feasible links are collected, said feasible links are weighted according to one or more weighting functions, an optimal set of feasible links is selected according to the results of a weighting function, said feasible links corresponding to unpreferred layers are collected, a set of chosen links is realized, and if all connections have been completed, a compaction routine is run, otherwise, said VCG is updated, and the process is repeated for a next routing track.

* * * * *